United States Patent [19]

Nola

[11] 4,052,648

[45] Oct. 4, 1977

[54] POWER FACTOR CONTROL SYSTEM FOR AC INDUCTION MOTORS

[75] Inventor: Frank J. Nola, Huntsville, Ala.

[73] Assignee: The United States of America as represented by the Administrator of the National Aeronautics and Space Administration, Washington, D.C.

[21] Appl. No.: 706,425

[22] Filed: July 19, 1976

[51] Int. Cl.² .................................... H02K 17/04
[52] U.S. Cl. ................................ 318/200; 318/227; 318/230
[58] Field of Search .............. 318/200, 227, 230, 231, 318/221 R, 216

[56] References Cited

U.S. PATENT DOCUMENTS 3,441,823  4/1969  Schlabach .................. 318/221 R

Primary Examiner—Herman J. Hohauser
Attorney, Agent, or Firm—L. D. Wofford, Jr.; George J. Porter; J. R. Manning

[57] ABSTRACT

A power factor control system for use with AC induction motors which samples line voltage and current through the motor and decreases power input to the motor proportional to the detected phase displacement between current and voltage to thereby provide less power to the motor, as it is less loaded.

5 Claims, 3 Drawing Figures

POWER FACTOR CONTROL SYSTEM FOR AC INDUCTION MOTORS

ORIGIN OF THE INVENTION

The invention described herein was made by an employee of the United States Government, and may be manufactured and used by or for the Government of the United States of America for governmental purposes without the payment of any royalties thereon or therefor.

BACKGROUND OF THE INVENTION

1. Field of the Invention

This invention relates to power input controls for motors, and particularly to a control which varies input power to an AC induction motor proportional to loading on the motor.

2. General Description of the Prior Art

The induction motor is perhaps the most rugged, and is certainly one of the most commonly used motors. It runs at an essentially constant speed which, within certain limits, is independent of both load and applied voltage. For efficient operation, the applied voltage should be a function of the load. Heretofore, this has not been practically accomplished. Line voltages are a matter of availability from a local utility. In the case of nominal 115-volt service, line voltage may be typically in the range of 105 to 125 volts and may not be constant with the service from a particular source and often varying significantly over a 24-hour period. In recognition of this, typically a 115-volt motor would be designed to deliver its rated load plus a safety margin at an under voltage condition of 105 to 110 volts. However, in taking care of the ability of the motor to perform its rated job at under voltage conditions, it becomes wasteful when line voltage is in the 120- to 125-volt range. Further, since this type of motor draws essentially the same current whether loaded or unloaded, motor efficiency goes down when less than a rated load is applied to the motor. Thus, where a user employs a motor over-rated for a job or a variable load is applied to the motor, efficiency suffers and waste of electrical power occurs.

3. Object of the Invention

It is the object of this invention to provide an electrical device which, when placed in circuit with the power input of an AC induction motor, will effect a reduction in power normally provided the motor when operated in either a condition where line voltage is greater than normal and/or motor loading is less than a rated load.

SUMMARY OF THE INVENTION

In accordance with the invention, the voltage applied to an AC induction motor and current through that motor are sampled, the phases of the samples are compared, and a control signal representative of the difference is obtained. This signal is then employed to vary the duty cycle portion of each cycle (portion of each cycle of alternating current) applied to the motor, decreasing the duty cycle proportional to phase difference to thereby regulate phase difference and thus improve the power factor to a more optimum state when there is otherwise present less than an optimum relationship between line voltage and motor load.

DETAILED DESCRIPTION OF THE DRAWINGS

Figure 2:
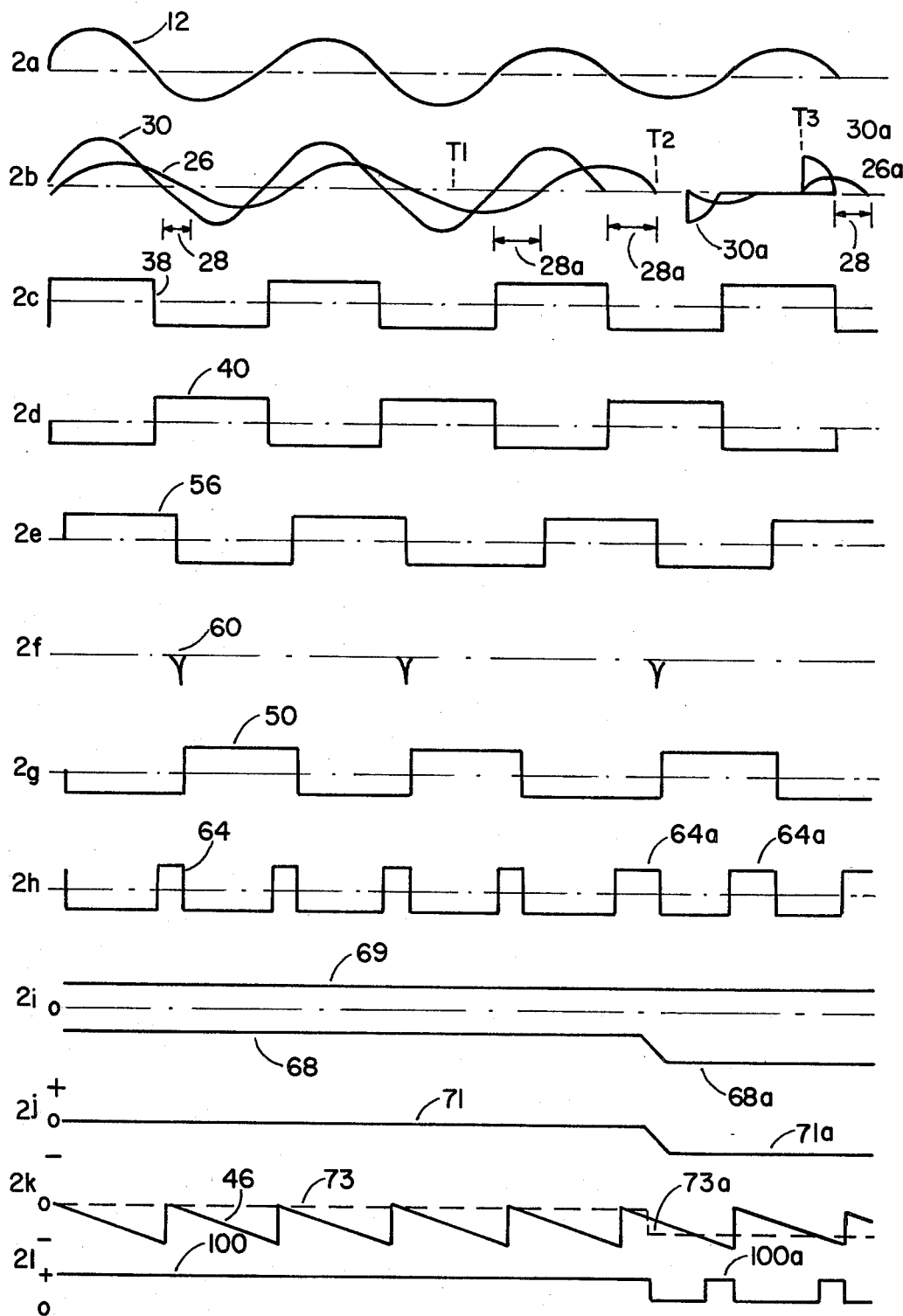
FIGS. 2a–2l are waveforms illustrating aspects of operation of the invention.

An AC induction motor 10 is powered by an alternating current voltage 12 (FIG. 2a) through switch 14 and connectible at terminals 16. The switched AC power is also applied to transformer 18 and circuit bias power supply 20. Triac 22 is connected in series with motor 10 and is triggered for controlled portions of each half cycle of power input. A small value resistor 24 of 0.010 to 0.020 ohms is connected in series with motor 10 and serves to develop a signal 26 (FIG. 2b) which is proportional to the current flow through the motor. FIG. 2b illustrates an instantaneous state of operation after initial start-up and with an initial optimum input voltage-load relationship, whereby triac 22 is fully on and where, thereafter, loading is substantially decreased. The initial current-voltage phase lag 28 for such optimum state of operation may vary from motor to motor and would be determined for each motor with which this invention is to be employed. In the present example, initially, optimum phase lag 28 is approximately 30°, and potentiometer 78 is adjusted to provide the zero error output signal for the control of the turn on time of triac 22 to maintain the phase angle of this or another selected value. The occurrence of increased current lag 28a at time $T_1$ depicts a sudden decrease in loading of motor 10. The detection of this is used, as will be further explained, to reduce the average amplitude of input voltage and thereby to effect a commanded, optimum, phase lag.

To further examine the circuitry, transformer 18, having center tap secondary 32, provides oppositely phased inputs to square wave shapers 34 and 36, and the resulting oppositely phased outputs, square wave 38 (from shaper 36) shown in FIG. 2c and square wave 40 (from shaper 34) shown in FIG. 2d, which are fed to saw tooth or ramp wave shapers 42 and 44, respectively. The outputs of the wave shapers are combined to provide a ramp wave each half cycle of the alternating current input as shown in waveform 46 of FIG. 2k. Waveform 38 is also used as a reference signal for the phase of input voltage and is fed to one input of multiplier 48, functioning as a phase detector, to which is also fed a current reference signal 50 shown in FIG. 2g. The current reference signal is generated as follows. Current signal 26 (FIG. 2b) from resistor 24 is fed to isolation transformer 52 and from it to square wave pulse shaper 54, which provides square wave 56 (FIG. 2e). This square wave is differentiated in differentiator 58 to provide spike pulses 60 shown in FIG. 2f, and the negative pulses (derived from the trailing edge of square wave 56) are used to trigger one-shot 62, which provides as an output the square waveform 50 shown in FIG. 2g. This square waveform commences at a time corresponding to the trailing or zero crossing point of current signal 26 (FIG. 2b) and has a duration (determined by the time constant of one-shot 26) corresponding to the length of a half cycle of AC input to the motor. Thus, there is generated a square wave current signal which is of the same duration as a half wave of voltage waveforms 12, 38, and 40, which is shifted in position proportional to the phase shift difference between current and voltage by virtue of the square wave current responsive signal being commenced at the precise end of (zero crossing) a half cycle of the current signal, which ending in time thus varies as a function of current lag.

Multiplier 48 multiplies voltage waveform 38 as shown in FIG. 2c with current waveform 50 shown in FIG. 2g to provide the product output waveform 64 shown in FIG. 2h. This output is integrated and reversed in sense in integrator 66. Except for this reversal, the output of integrator 66 would be maximum for conditions of no current lag and minimum for large current lags. To achieve the opposite sense, a reference voltage $v_f$ is fed to one input of integrator 66 where it is negatively summed with the output of multiplier 48. As a result, the integrated output of integrator 66 is of a value 68, shown in FIGS. 2i and 2j, which varies in magnitude directly with phase angle. In other words, the greater the phase angle the greater the system error which is to be corrected. Output 68 (output 68a after time $T_2$) of integrator 66, which is proportional to the phase angle, is fed to the negative input of operational amplifier 70. To this same input is also applied an opposite polarity phase angle command voltage 69 (FIG. 2i), being applied through resistor 76 from potentiometer 78. Potentiometer 78 is calibrated to provide an output voltage representative of a desired phase angle to be commanded. Thus, when the system is operating with a commanded phase angle, the output of integrator 66 would be equal and opposite to the command signal from potentiometer 78, a condition shown by FIG. 2j as existing up to time $T_2$. At this point, by virtue of increased output 64a from multiplier 48 because of increase phase shift 28, the output of integrator 66 increases negatively to a level 68a. Thus, there would initially be a net zero error voltage input 71 (FIG. 2j) to the negative input terminal of amplifier 70. Then, for the indicated phase lag in excess of the commanded phase lag, there would be a finite negative error signal 71a applied to this input, as shown. When this occurs, amplifier 70, which is a high gain amplifier, provides an amplified error signal 73a (FIG. 2k) to comparator 102 to effect such decrease in duty cycle of triac 22 necessary to retain the commanded, optimum, phase angle, in a manner to be described. As shown, this is effected during any interim between times $T_2$ and $T_3$.

In order to assure that when motor 10 is first turned on that it will develop maximum torque for a sufficient period to bring the motor up to speed, operation of the control system of this invention is initially delayed. This delay is achieved by delay circuit 80 consisting of capacitor 82 and resistor 84 connected in series between a bias output of power supply 20, which power supply is energized at the same time as motor 10, that is, by the closing of switch 14. Resistor 84 is connected between common ground and the positive input of operational amplifier 70. With a positive potential signal applied to capacitor 82, the initial charging current through resistor 84 is of a value sufficient (determined by the time constant of the combination of resistor 84 and capacitor 82) to override a maximum input applied to the negative terminal for a period of several seconds or longer, depending upon the application. A feedback circuit consisting of resistor 86 and capacitor 88, connected in parallel between the output of amplifier 70 and the negative input of the amplifier, provides the necessary gain and roll off frequency required for system stability.

Triac 22 is gated "on" by a gating signal coupled from the secondary of transformer 90 across an input of triac 22. This gating signal is a high frequency signal generated by oscillator 92 and applied to the primary of transformer 90 through gate or electronic switch 94. Resistor 96 and diode 98 are connected in series across the primary of transformer 90 in order to suppress inductive voltages to a safe level consistent with the semiconductors used. Gate 94 is triggered by pulses 100 (shown in FIG. 2l, and which illustrates "on" time of oscillator 92) from comparator 102 responsive to ramp waveform 46 (FIG. 2k) and control input signal 73 (FIG. 2k). Output pulses 100 from comparator 102 occur during the interval in which control signal 73 exceeds (is more positive than) ramp voltage 46. Thus, in the present example, the output of amplifier 70 initially provides a maximum (in a positive direction) output, and pulses 100 would have a 100 percent duty cycle extending over a full ramp period. This would gate "on" oscillator 92 and thereby triac 22 for the entire portion of input voltage cycle as initially shown for voltage waveform 30 in FIG. 2b. This, it will be assumed, continues for several seconds and until time $T_1$, at which time the motor loading decreases to near zero. When this occurs, phase lag 28 will increase to some larger value of phase leg 28a, and this will increase, resulting in a shift to the right of current pulse waveform 50 (FIG. 2g), which in turn will provide an increased width output pulse 64 from multiplier 48 (at time $T_2$). In turn, this will provide an increase in the output of integrator 66 and input to amplifier 70, which will change from a zero level (level 71) to a discrete negative level (level 71a), as shown in FIG. 2j. As a result, amplifier 70 will provide an amplified, less positive, output error signal 73a commencing at time $T_2$, as shown in FIG. 2k. When this occurs, comparator 102 provides a reduced width pulse 100a to gate 94, and it triggers "on" triac 22 for like decreased width periods to produce a change in input voltage, changing (at time $T_3$) from that shown by waveform 30 to that shown by waveform 30a.

Thus, motor input voltage waveform 30 goes through a transition during the period of $T_1$ to $T_3$, having an initial phase lag 28 to an increased phase lag 28a and then back to the commanded phase lag 28, shifting from full width cycles 30 to extremely short width duration input cycles 30a. The shift in input voltage has been that necessary to re-establish the commanded currentvoltage phase lag, power factor, to thus maintain an optimum power input to motor 10. Had this not been done, the phase angle would have increased substantially, and thus the power factor would have decreased substantially, resulting in a significant waste of power.

Figure 3:
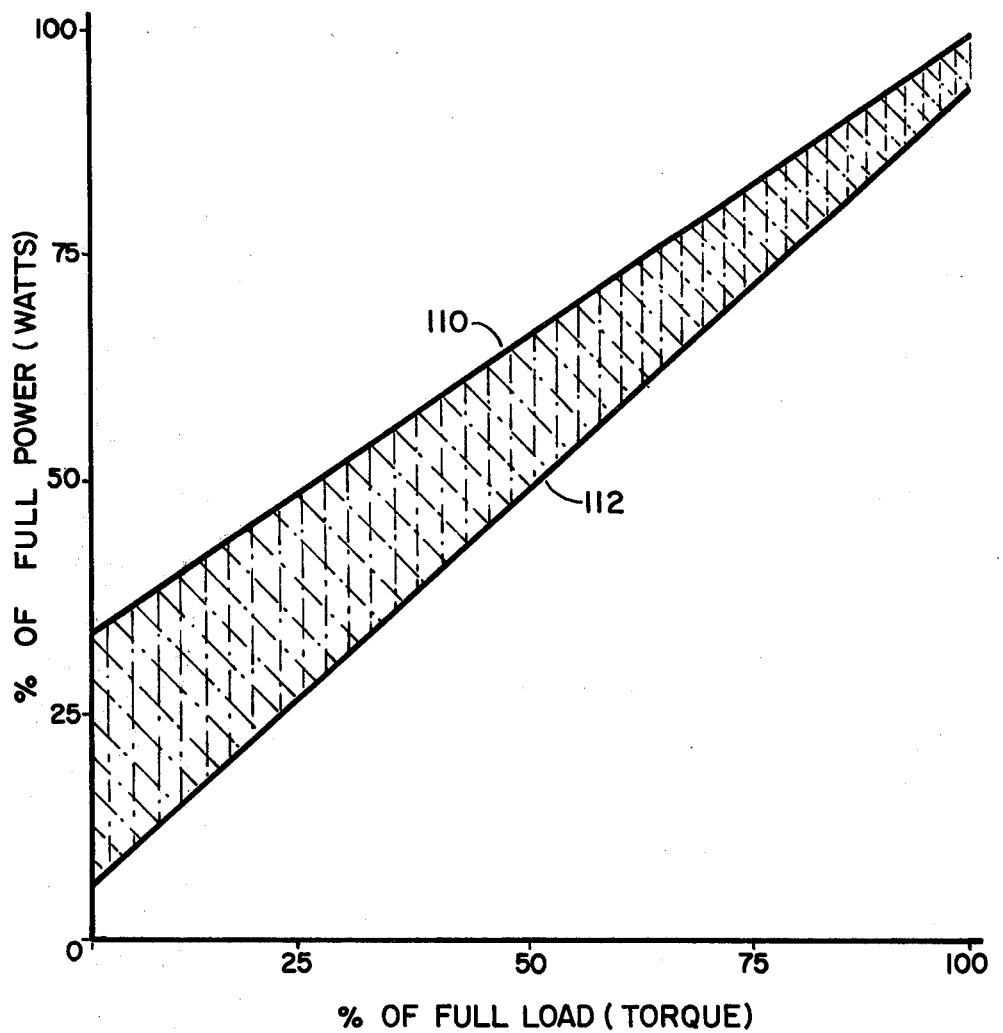
FIG. 3 is a plot illustrating power drawn by a motor for different states of loading and with and without the control system of this invention.

FIG. 3 plots the percent of full power applied to motor 10 versus percent of full load, or torque, and line 112 illustrates a case where the control system of this invention is employed. Line 110 illustrates a case where it is not. The hatched difference between the lines is indicative of the power saved by employment of the invention.

Figure 1:
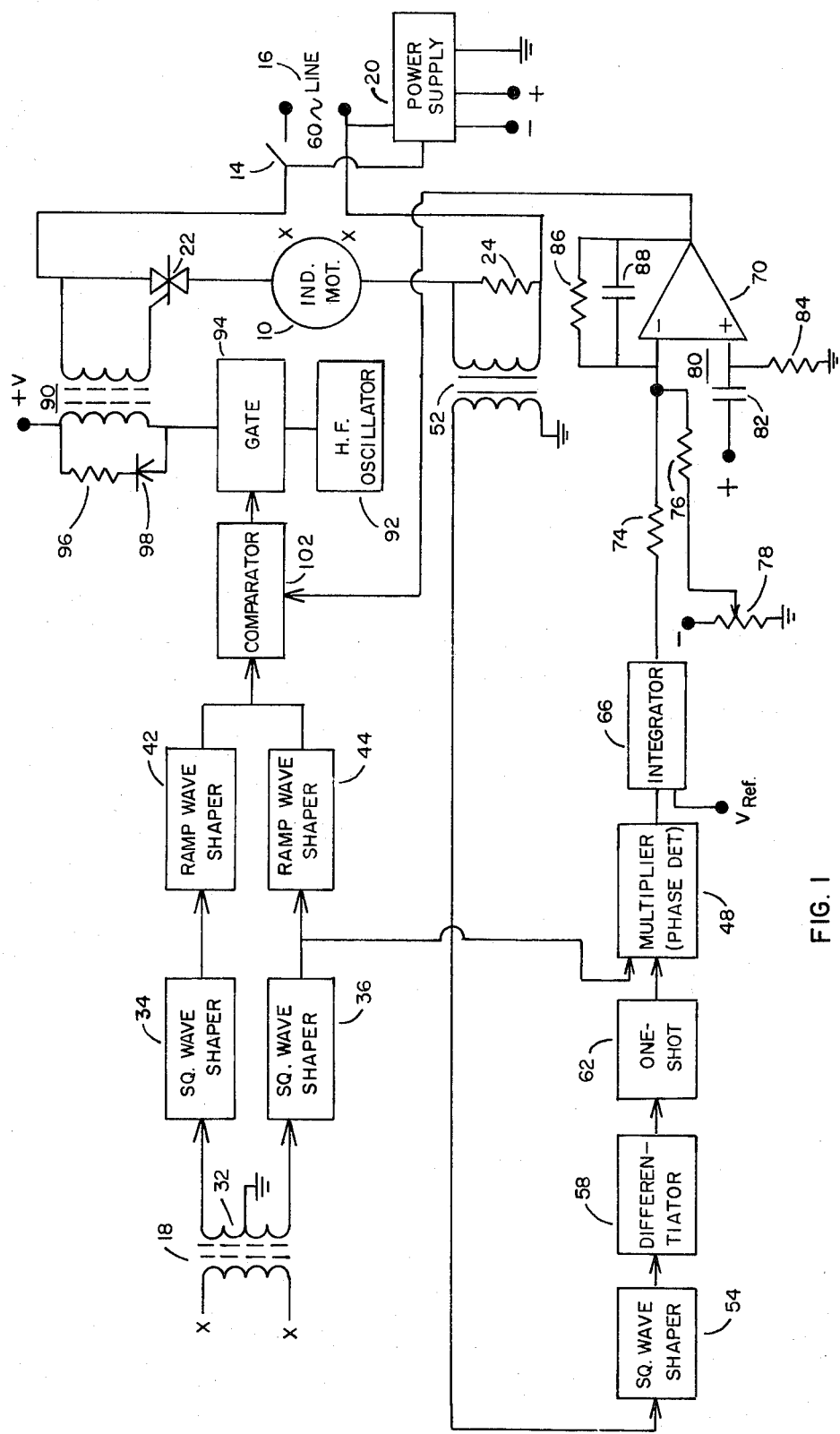
FIG. 1 is an electrical schematic diagram of an embodiment of the invention.

While the invention illustrated herein is shown as being usable with a single phase device, it may be connected in circuit with each phase of a multi-stage induction motor. Thus, in the case of a Wye-connected three phase motor, three of the control systems illustrated in FIG. 1 will be employed, one being connected in each of the three phases with each referenced to ground (the Wye of the motor). In the case of a delta-connected motor, it will be necessary to place a triac and sampling resistor in series with each winding of the motor, and the voltage reference would be obtained for that control device across the two input power leads to that winding.

Having thus described my invention, what is claimed is:

1. A power factor control system for an AC induction motor comprising:
    current sampling means including means adapted to be placed in circuit with each phase winding of a said motor for providing an AC output signal in phase with the current through said winding;
    voltage sampling means adapted to sense the voltage of an electrical input applied to said winding and for providing an output signal in phase with said voltage across said winding;
    phase detection means responsive to the outputs of said current sampling means and said voltage sampling means for providing an output which varies in accordance with the difference in phase between said current and said voltage; and
    a control means adapted to be electrically connected in series with each said winding of said motor, and responsive to the output of said phase detection means for varying the duration of "on" time of each cycle of input power to said winding inversely proportional to the difference in phase between said current and said voltage;
    whereby an increase in difference between the magnitude of said voltage and the magnitude of load applied to said motor is compensated for by a reduction in power to said motor, generally improving its efficiency.

2. A control system as set forth in claim 1 wherein said current sampling means includes a resistor adapter to be placed in series with a said winding and means for providing a signal proportional to the voltage across said resistor.

3. A control system as set forth in claim 2 wherein:
    said voltage sampling means comprises means for providing a square wave pulse output at the frequency of the voltage applied to said winding; and
    said current sampling means comprising means responsive to said voltage from said resistor for providing square wave output pulses of the width and height of said pulses from said voltage sampling means, and each pulse having an edge coinciding with the zero crossing of said voltage across said resistor.

4. A control system as set forth in claim 3 wherein said phase detection means includes means for multiplying the magnitudes of said square wave pulses from said voltage and current sampling means.

5. A control system as set forth in claim 4 wherein said control means includes:
    means responsive to the voltage applied to said winding of said induction motor for providing a saw tooth wave at double the frequency of said voltage;
    pulse generating means responsive to a comparison of said saw tooth voltage and said output of said phase detection means for providing output pulse bursts of high frequency signal in which the width of the pulse bursts is directly proportional to the time in which said output of said phase detection means differs in a selected direction from the value of said saw tooth wave; and
    switching means adapted to be placed in circuit with said winding of said motor and responsive to said pulse generating means for varying the width of half cycles of power applied to said winding of said motor in accordance with the width of said bursts of high frequency signal.

* * * * *